US011860612B2

(12) United States Patent
Lin et al.

(10) Patent No.: US 11,860,612 B2
(45) Date of Patent: Jan. 2, 2024

(54) AUTOMATIC TESTING METHOD AND AUTOMATIC TESTING DEVICE EMPLOYING THE METHOD

(71) Applicant: Fulian Precision Electronics (Tianjin) Co., LTD., Tianjin (CN)

(72) Inventors: Wei-Chen Lin, New Taipei (TW); Duo Qiu, Tianjin (CN); Ya-Nan Bian, Tianjin (CN)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 78 days.

(21) Appl. No.: 17/730,387

(22) Filed: Apr. 27, 2022

(65) Prior Publication Data

US 2023/0315068 A1    Oct. 5, 2023

(30) Foreign Application Priority Data

Mar. 30, 2022   (CN) .......................... 202210331658.5

(51) Int. Cl.
G05B 19/418      (2006.01)
(52) U.S. Cl.
CPC .................. G05B 19/41875 (2013.01); *G05B 2219/32368* (2013.01)
(58) Field of Classification Search
CPC ............... G05B 19/41875; G05B 2219/32368
See application file for complete search history.

(56) References Cited

U.S. PATENT DOCUMENTS

| 2013/0073906 | A1* | 3/2013 | Hsieh | G06F 11/2205 |
| | | | | 714/E11.169 |
| 2018/0351790 | A1* | 12/2018 | Khemani | H04L 41/08 |
| 2019/0143541 | A1* | 5/2019 | Nemallan | B25J 9/161 |
| | | | | 700/246 |
| 2020/0161823 | A1* | 5/2020 | Tsai | G01R 31/2808 |
| 2021/0090676 | A1* | 3/2021 | Covington | G11C 11/4093 |
| 2021/0103510 | A1* | 4/2021 | Pena | G06F 11/2284 |

* cited by examiner

*Primary Examiner* — Thomas C Lee
*Assistant Examiner* — Ameir Myers
(74) *Attorney, Agent, or Firm* — ScienBiziP, P.C.

(57) ABSTRACT

An automatic testing method includes obtaining a positioning image, analyzing position of a plurality of slots of the test motherboard in the positioning image to generate route information for insertion and testing of components; wherein photographing test motherboard and obtaining positioning image focused on the test motherboard, controlling the clamping device to insert a plurality of the components into the slots according to the route information, controlling the test motherboard to test the components, determining if there is a faulty component, controlling the clamping device to withdraw and insert the components into other slots according to the route information and controlling the test motherboard to retest the components again if there is no faulty component. An automatic testing device and a non-volatile storage medium performing the above-described method are also disclosed.

20 Claims, 4 Drawing Sheets

AUTOMATIC TESTING METHOD AND AUTOMATIC TESTING DEVICE EMPLOYING THE METHOD

TECHNICAL FIELD

The present disclosure relates to the field of automation in manufacturing, and more particularly to automatic testing method and testing device.

BACKGROUND

Electronic equipment can be assembled from multiple components, and some parts need to be electrically tested during the production process to ensure that the parts can achieve their basic functions. When testing components, it is necessary to move the components and plug them into a test motherboard, and then supply power to the test motherboard to complete the electrical test of the components. For example, in the production process of a server, the components may be memory sticks used in the server, and the operator needs to plug multiple memory sticks on the test motherboard to conduct electrical tests on the multiple memory sticks. The action of moving the components to the test motherboard and inserting the components into the test motherboard is done manually by the operator. When the operator tests a batch of components, the components need to be manually inserted and unplugged many times, which is not convenient.

Therefore, improvement is desired.

SUMMARY OF THE DISCLOSURE

The embodiment of the present disclosure aims to provide an automatic testing method and testing device to solve the above technical problems, so as to reduce the manual plugging action of operators and improve the convenience of operation.

The embodiment of the present disclosure provides an automatic testing method, the automatic testing method can be applied to an automatic testing device, the method includes:

obtaining a positioning image; analyzing position of a plurality of slots of the test motherboard in the positioning image to generate route information; wherein the focus of the positioning image comprises the test motherboard; controlling the clamping device to insert a plurality of the components into the slots according to the route information; controlling the test motherboard to test the components; determining if there is a faulty component; and controlling the clamping device to insert the components into other slots according to the route information and controlling the test motherboard to repeat the test if no faulty component is found.

In some embodiments, wherein the controlling of the clamping device to insert the components into other slots according to the route information, further includes: removing a designated component from the slot and creating a vacant slot on the test motherboard; taking out remainder of the components from original slot in sequence along a preset direction and inserting such components into adjacent and vacant slots; and inserting the designated component into the vacant slot.

In some embodiments, wherein if there is no faulty component found, the method further includes: determining a number of times that the components are tested on the test motherboard as being less than or greater than a preset first threshold; and controlling the clamping device to insert the components into other slots according to the route information and controlling the test motherboard to retest the components again if the number of times that the components are tested is less than or equal to the first threshold.

In some embodiments, the method further includes: determining a number of times that the component is moved to another test motherboard as being less than or greater than a second threshold when the component is tested; and controlling the clamping device to move the components to another test motherboard, controlling another test motherboard to test the components if the number of times of motherboard moves is less than or equal to the second threshold.

In some embodiments, the method further includes: stopping the testing if the number of times of replacing the test motherboard is greater than the second threshold.

In some embodiments, the method further includes: determining whether the number of times the component is moved to another test motherboard is less than a second threshold if the number of times that the components are tested on the test motherboard is greater the first threshold.

In some embodiments, the method further includes: controlling a camera device to take a positioning image of the test motherboard.

In some embodiments, the method further includes: outputting an alarm information if there is a faulty component.

The embodiment of the present disclosure provides an automatic testing device, the automatic testing device includes a test motherboard, a clamping device, a storage device, and a at least one processor. The test motherboard defines a plurality of slots, the clamping device is configured for inserting a plurality of components into the slots, the storage device is used to store computer programs, the processor executes the automatic testing method.

The embodiment of the present disclosure provides a storage medium, the storage medium includes computer instructions, when the computer instructions run on the automatic testing device, automatic testing device executes the automatic test method.

The automatic testing method, device and storage medium provided by the present disclosure can automatically plan the movements of the clamping device through the positioning image, so as to control the clamping device to automatically insert multiple components into multiple slots, reduce the manual plugging and plugging operation of components by operators, and improve the convenience of operation.

DETAILED DESCRIPTION

The technical solutions in the embodiments of the present disclosure will be described in conjunction with the accompanying drawings in the embodiments of the present disclosure. Obviously, the described embodiments are part of the embodiments of the present disclosure, not all of them. Based on the embodiments of the present disclosure, all other embodiments obtained by those of ordinary skill in the art without creative work shall fall within the protection scope of the present disclosure.

It should be noted that "at least one" in the embodiment of the present disclosure refers to one or more, and multiple refers to two or more. For example, the terms "first", "second", "third", "fourth" in the description, claims and drawings of the application are used to distinguish similar objects, rather than to describe a specific order.

Figure 1:
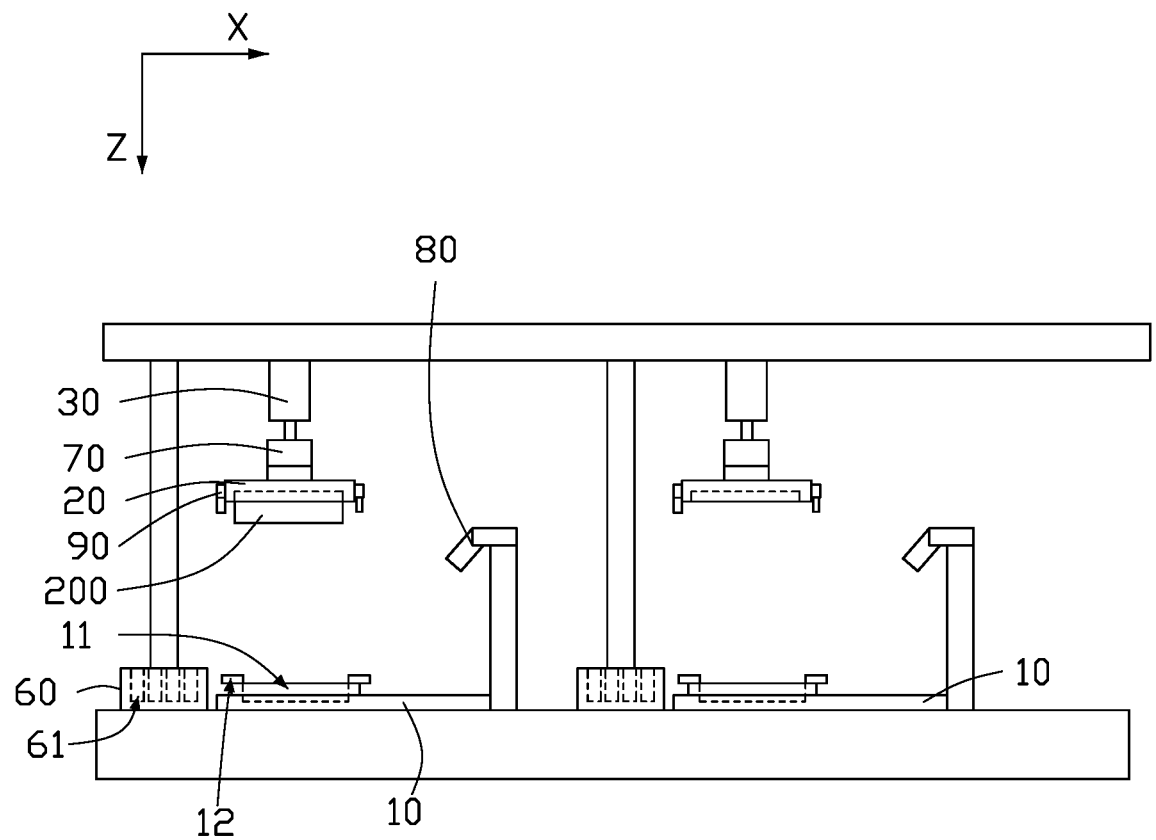
FIG. 1 is a schematic diagram of an automatic testing device according to an embodiment of the present disclosure.

FIG. 1 illustrates an automatic testing device 100 in accordance with an embodiment of the present disclosure.

The automatic testing device 100 is used to test the components 200. For example, the component 200 may be a Dual-Inline-Memory-Modules (DIMM) used in a computer or a service therein.

In the embodiment, the automatic testing device 100 may include a test motherboard 10, a gripping device 20, and a moving device 30. The test motherboard 10 defines a plurality of slots 11 at intervals. The gripping device 20 is used for clamping or releasing the component 200, and after inserting the component 200 into the slot 11, the component 200 is released. The gripping device 20 is fixedly mounted on the moving device 30. The moving device 30 is used to drive the gripping device 20 to move in multiple directions. The movement of the gripping device 20 drives the component 200 or several of them to move synchronously.

After the gripping device 20 clamps the component 200, the moving device 30 drives the gripping device 20 to move to a position corresponding to the slot 11, and the component 200 is inserted into the slot 11. Then the gripping device 20 releases the component 200 and is driven away from the component 200 by the moving device 30.

Figure 2:
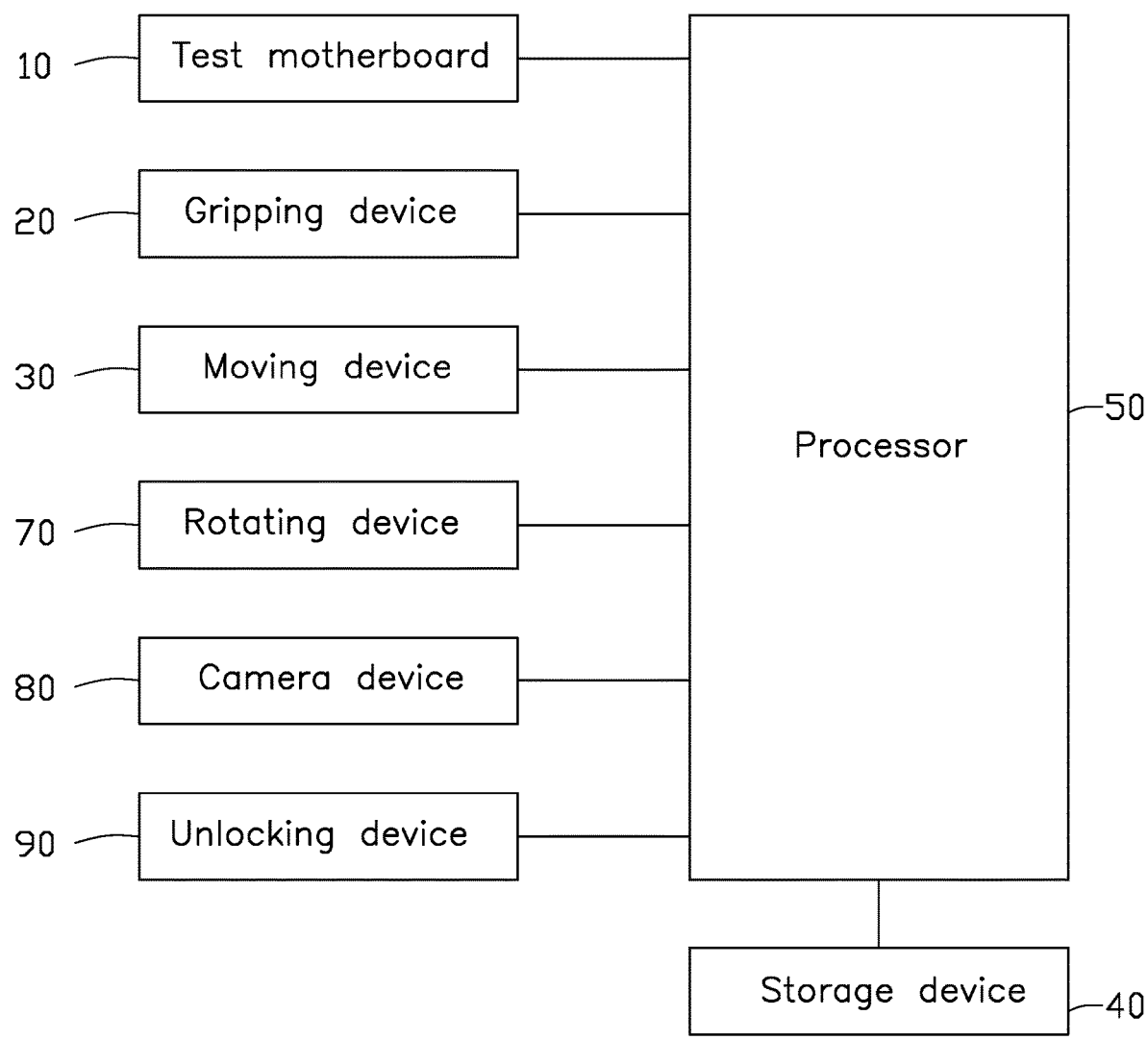
FIG. 2 is a block diagram of the testing device according to another embodiment of the present disclosure.

Referring to FIG. 1 and FIG. 2, in the embodiment, the automatic testing device 100 may also include a storage device 40 and a processor 50. The storage device 40 is used to store computer programs. The processor 50 is connected in communication with the test motherboard 10, the gripping device 20, the moving device 30 and the storage device 40. The processor 50 is used to execute the computer programs stored in the storage device 40 to run the automatic testing method.

When the processor 50 runs the automatic testing method, the processor 50 can control the moving device 30 to work to drive the gripping device 20 to move in the spaced direction of the plurality of the slots 11 and in the direction opposite to the test motherboard 10. The processor 50 may also control the gripping device 20 to grip or release the component 200 while the processor 50 is running the automatic testing method.

It can be understood that the communication connection may be a wired communication connection realized through wires, data lines, or a wireless communication connection realized through a wireless network, which is not limited in the embodiments of the present disclosure.

The processor 50 may be a general-purpose central processing unit (CPU), a microprocessor, an application-specific integrated circuit (ASIC), a programmable logic controller (PLC), or one or more of an integrated circuit that controls the execution of the above program.

The storage device 40 may be read-only memory (ROM) or other type of static storage device that can store static information and instructions, random access memory (RAM) or other type of static storage device that can store information and instructions dynamic storage device. The storage device 40 can also be an electrically erasable programmable read-only memory (EEPROM), a compact disc read-only memory (CD-ROM), or other optical disc storage, optical disc storage (including compact discs), laser disc, compact disc, digital versatile disc, BLU-RAY disc), magnetic disk storage medium or other magnetic storage device, or any other device capable of carrying or storing desired program code in the form of instructions or data structures and accessible by a computer other media.

It can be understood that the storage device 40 may exist independently and be connected to the processor 50. The storage device 40 may also be integrated with the processor 50. For example, the processor 50 may be a programmable logic controller, and the storage device 40 and the processor 50 are provided independently.

When the 200 is inserted into the slot 11, the test motherboard 10 is electrically connected to the component 200. When testing the components 200, after the components 200 are inserted into the slots 11 on the test motherboard 10, the test motherboard 10 is controlled to be powered on and work, in order to test whether the components 200 operate normally with a rated power, and whether the basic functions of the components 200 can be realized. For example, the component 200 may be a memory card, and when testing the component 200, it may be to test whether the component 200 can store or read data.

Figure 3:
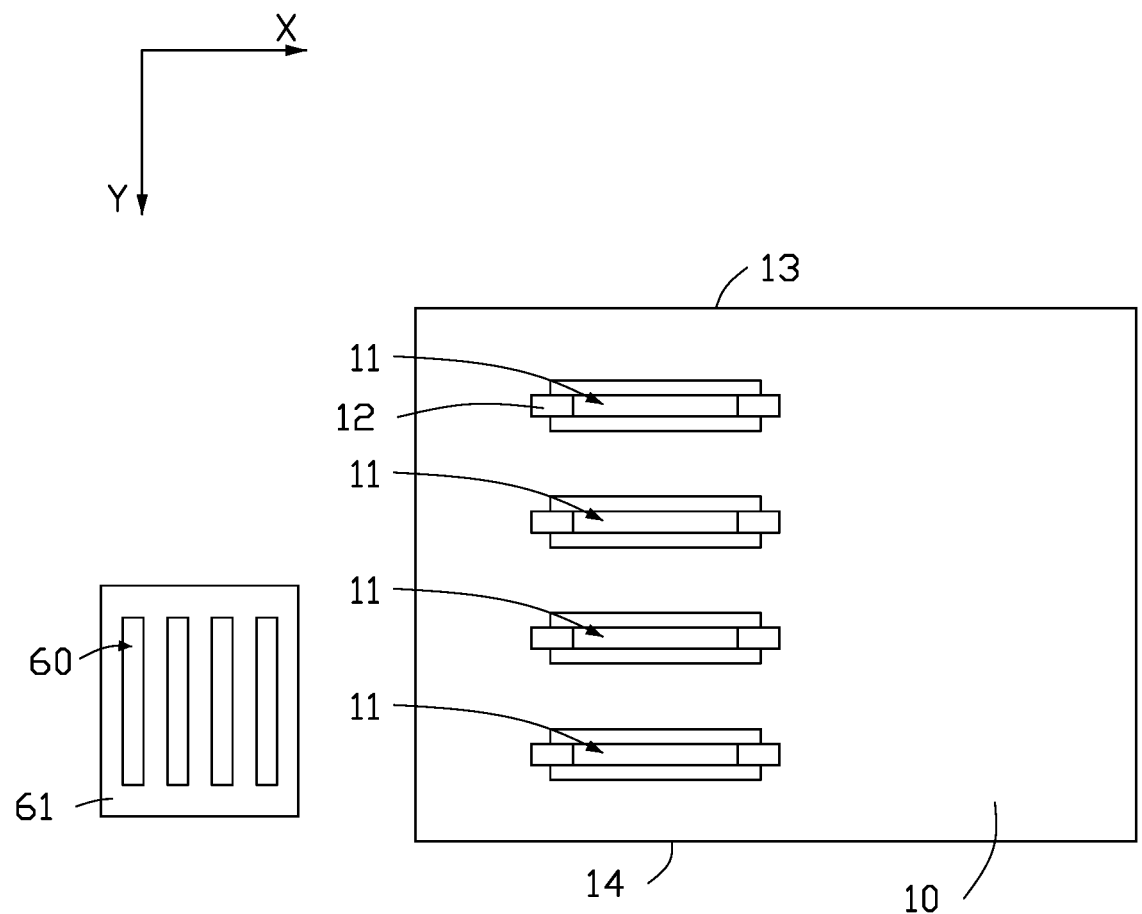
FIG. 3 is a schematic diagram of the testing device according to another embodiment of the present disclosure.

Referring to FIG. 3, in the embodiment, the components 200 need to be tested multiple times on the test motherboard 10. Before each test, the insertion position of the slot 11 where the component 200 is inserted must be different. Each test needs to move the component 200 from one slot 11 to another slot 11 where the component 200 has not been inserted before.

In the embodiment, the moving device 30 may be assembled from a plurality of linear drive members. The linear drive member may be, but is not limited to, a linear motor, a rodless cylinder. The moving device 30 can drive the gripping device 20 to move in a first direction and a second direction to align the gripping device 20 with the slot 11. The moving device 30 can also drive the gripping device 20 to move in a third direction, so as to drive the gripping device 20 to approach or move away from the slot 11. The first direction may be the X direction as shown in FIG. 1 and FIG. 3 and its opposite direction, the second direction may be the Y direction as shown in FIG. 3 and its opposite direction, and the third direction may be the Z direction as shown in FIG. 1 and its opposite direction.

In the embodiment, the gripping device 20 may be a pneumatically driven or electrically driven. The gripping device 20 can be a pneumatic gripper or an electric gripper. The gripping device 20 can grip a component 200 and release the component 200 when the component 200 is inserted into the socket 11.

In another embodiment, the components 200 can be pre-installed in an accommodating box 60, and the accommodating box 60 defines a plurality of accommodating slots 61, each accommodating slot 61 receives one component 200. The processor 50 controls the gripping device 20 to move to a position corresponding to the accommodating box 60, controls the gripping device 20 to grip a component 200, and then controls the gripping device 20 to move to a position corresponding to the test motherboard 10 and controls the gripping device 20 to insert the component 200 into the slot 11.

When the test motherboard 10 needs to change the slot 11 into which the components 200 are inserted, the processor 50 can control the gripping device 20 to pull out a component 200 from the slot 11, move the component 200 into the accommodating box 60, and then control the gripping device 20 to move the plurality of components 200 one by one, and insert them into the vacant slots 11, so that the plurality of components 200 on the test motherboard 10 are replaced by the slots 11. The processor 50 can then control the gripping device 20 to insert the components 200 in the accommodating box 60 into the only vacant slot 11 on the test motherboard 10 to complete the replacement of the slots 11 of the components 200.

In the embodiment, the accommodating box 60 can be arranged on the side of the test motherboard 10.

In some embodiments, the automatic testing device 100 further includes a rotating device 70, and the rotating device 70 is connected between the moving device 30 and the gripping device 20. The rotating device 70 is fixedly installed on the side of the moving device 30 facing the test motherboard 10. The gripping device 20 is fixedly mounted on the rotating device 70. The rotating device 70 can drive the gripping device 20 to rotate to adjust the deflection angle of the component 200 clamped by the gripping device 20. The change of the deflection angle of the component 200 can prevent misalignment of the component 200, which would prevent the component 200 being inserted into the slot 11.

The rotating device 70 may be an electrically driven or pneumatically driven rotating member, and the rotating device 70 may be a motor or a rotating cylinder.

The way of fixing the rotating device 70 with the moving device 30 and the gripping device 20 may be, but is not limited to, screw fixing, welding fixing, and the like.

In some embodiments, a buffer member (not shown) may also be disposed between the moving device 30 and the gripping device 20. When the component 200 is inserted into the slot 11 by the gripping device 20, the buffer member can buffer the pressure of the gripping device 20 on the test motherboard 10, so as to avoid damage to the component 200 or the test motherboard 10, preventing excessive stress when the component 200 is inserted into the slot 11.

In some embodiments, a pressure detector (not shown) may also be disposed between the moving device 30 and the gripping device 20. The pressure detector is used to detect relative pressures between the moving device 30 and the gripping device 20 when the gripping device 20 inserts the component 200 into the slot 11. The pressure detector is connected in communication with the processor 50, and the pressure detector can output detection information to the processor 50. After analyzing the detection information, the processor 50 can determine the relative pressures between the moving device 30 and the gripping device 20 and control the moving device 30 to stop working before the pressure is large enough to damage to the component 200 and the test motherboard 10.

It can be understood that the pressure detector may be an electronic device with a pressure detection function, and the pressure detector may be, but not limited to, a pressure sensor.

The embodiments of the present disclosure do not limit the installation positions of the pressure detector and the buffer member. For example, the pressure detector and the buffer member may be installed between the rotating device 70 and the gripping device 20. For another example, the pressure detector and the buffer member may also be installed between the rotating device 70 and the moving device 30.

In some embodiments, the automatic testing device 100 further includes a camera device 80. The camera device 80 is connected in communication with the processor 50. The camera device 80 with the moving device 30, and the test motherboard 10 are set in certain positions. The camera device 80 is used for photographing the test motherboard 10 and generating a positioning image. The processor 50 obtains the positioning image and determines the positions of each of the plurality of the slots 11.

For example, the camera device 80 may be a charge coupled device (CCD) camera.

The photographing content of the camera device 80 may include the accommodating box 60 and the test motherboard 10. The positioning image includes the accommodating box 60 of the test motherboard 10. The processor 50 analyzes the positioning image and plans a route where the gripping device 20 clamps the component 200 from the accommodating box 60, moves to the test motherboard 10 and inserts the component 200 into the slot 11.

The automatic testing device 100 may be mounted on a workbench. The moving device 30, the accommodating box 60 and the test motherboard 10 can be fixedly installed on the workbench. The camera device 80 can be fixedly mounted on a mounting frame. The mounting frame is fixedly installed on the workbench. The camera device 80 is suspended above the test motherboard 10, and the manner of installation can be but is not limited to screw fixing.

In some embodiments, a plurality of the test motherboards 10 may be provided. After the components 200 are tested on one test motherboard 10 for many times, the processor 50 can control the gripping device 20 to grasp and move the components 200 to another test motherboard 10 and perform multiple tests again on another test motherboard 10.

When the components 200 are tested on the multiple test motherboards 10, and the multiple tests are performed on each test motherboard 10, the testing of the components 200 ends.

It can be understood that the test motherboards 10 are provided with multiple camera devices 80 and multiple accommodating boxes 60.

The embodiments of the present disclosure do not limit the number of the moving devices 30 and the gripping devices 20. For example, a plurality of the test motherboards 10 may be provided with a plurality of the moving devices 30 and a plurality of the gripping devices 20. The moving devices 30 may be avoidance setting. Each moving device 30 can only drive the gripping device 20 to move between the two test motherboards 10. For example, only one moving device 30 and one gripping device 20 may be provided in the test motherboards 10, and the moving device 30 may drive the gripping device 20 to move among the test motherboards 10.

The embodiments of the present disclosure do not limit the manner in which the component 200 is moved from one test motherboard 10 to another test motherboard 10. For example, the processor 50 can control the gripping device 20 to move the components 200 on the test motherboard 10 into the accommodating box 60 corresponding to another test motherboard 10. The processor 50 plans a route according to the positioning image corresponding to the other test motherboard 10, and controls the gripping device 20 to remove the components 200 from the accommodating box 60 one by one, and insert same into the slots 11 of another test motherboard 10 one by one. For example, the processor 50 may plan a route for moving the component 200 from one test motherboard 10 to another test motherboard 10 based on the positioning image, control the gripping device 20 to remove the components 200 from the slots 11 of the test motherboard 10 one by one, and insert same into the slot 11 of another test motherboard 10.

In some embodiments, the test motherboard 10 is provided with a locking member 12. When the component 200 is inserted into the slot 11, the component 200 pushes the locking member 12 to rotate, and the locking member 12 locks the component 200 in the slot 11. An unlocking device 90 is fixedly connected to the side of the gripping device 20. The unlocking device 90 is used to rotate the locking member 12 in reverse, thereby releasing the locking member 12 from the component 200. The processor 50 is connected in communication with the unlocking device 90. The processor 50 can control the operation of the unlocking device 90 to unlock the locking member 12 when the component 200 is removed from the slot 11.

The unlocking device 90 is a device that can move linearly by electric drive or pneumatic drive, and the unlocking device 90 can be an air cylinder. When the processor 50 needs to control the gripping device 20 to take out the component 200 from the slot 11, the processor 50 controls the moving device 30 to work and drives the gripping device 20 to approach the component 200. Then the processor 50 controls the unlocking device 90 to work, the unlocking device 90 pushes the locking member 12 to rotate, and releases the locking member 12 from locking the component 200. Then the processor 50 can control the gripping device 20 to grip the component 200, and then control the moving device 30 to move the gripping device 20 to a designated position.

In the embodiment of the present disclosure, the processor 50 can control the camera device 80, the gripping device 20, the moving device 30, the unlocking device 90 and the test motherboard 10 to cooperate with each other by running the automatic testing method to test the component 200.

Figure 4:
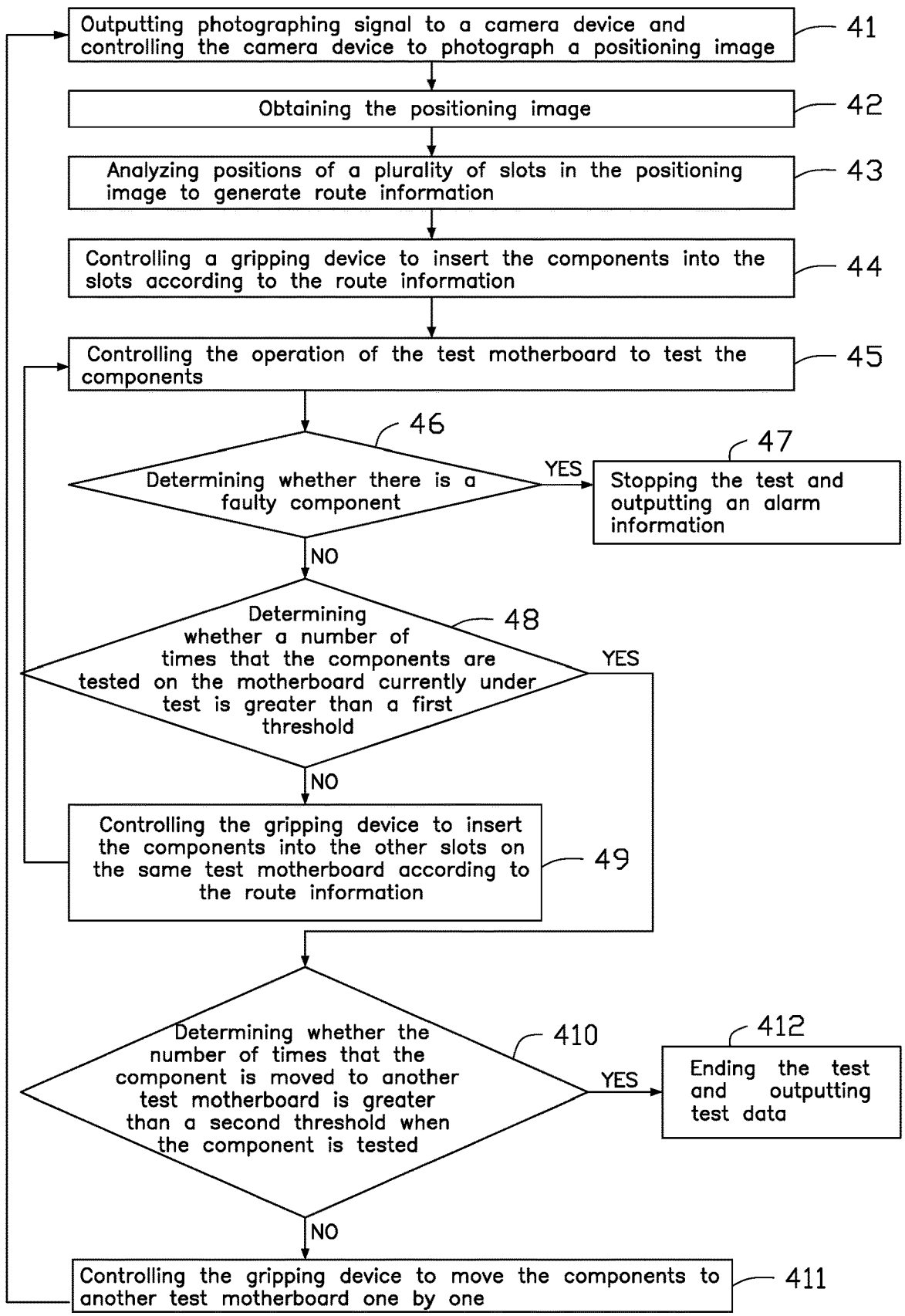
FIG. 4 is a flowchart of automatic testing method according to an embodiment of the present disclosure.

FIG. 4 is a flowchart depicting an embodiment of an automatic testing method.

In one embodiment, the automatic testing method can be applied to the automatic testing device 100.

Each block shown in FIG. 4 represents one or more processes, methods, or subroutines, carried out in the example method. Furthermore, the illustrated order of blocks is illustrative only and the order of the blocks can change. Additional blocks can be added or fewer blocks may be utilized, without departing from the present disclosure. The example method can begin at block 41.

At block 41, outputting photographing signal to a camera device 80, and controlling the camera device 80 to take photograph to become the positioning image.

After the operator adds the components 200 that need to be tested to the accommodating box 60, the operator determines that the component 200 can be tested, and then can output instructions to the processor 50. After the processor 50 receives the instruction, it can start to run the automatic testing method.

The photographing content of the positioning image may include the test motherboard 10, the photographing content of the positioning image and may also include the test motherboard 10 and the accommodating box 60.

At block 42, obtaining the positioning image.

After the processor 50 obtains the positioning image, the processor 50 can analyze the positioning image to plan the movement route of the gripping device 20.

At block 43, analyzing positions of a plurality of slots 11 in the positioning image to generate route information.

In one embodiment, the positioning coordinates of plurality of the accommodating slots 61 have been preset and input to the processor 50. The processor 50 can plan a route for the component 200 to move from the accommodating slot 61 to the slot 11 and generate the route information according to the positioning coordinates of the accommodating box 60 and the positions of the slots 11.

In another embodiment, when the processor 50 identifies the positioning image, the processor 50 simultaneously determines the positions of the accommodating slots 61 and the slots 11 in the positioning image and plans a route for the component 200 to move from the accommodating slot 61 to the slot 11, to generate the route information.

In some embodiments, the processor 50 may generate a coordinate system according to the positioning image when identifying the positions of the slots 11 or the slots 11 and the accommodating slots 61. The processor 50 determines the coordinates of each slot 11 and each accommodating slot 61 in the coordinate system, plans a route from the coordinate point where the accommodating slot 61 is located to the coordinate point where the slot 11 is located on the coordinate system, to generate the route information.

In some embodiments, the route information includes the movement route and rotation angle of the gripping device 20 when the component 200 is moved from the accommodating box 60 to the slot 11. When the processor 50 is planning the moving route of the component 200, the required rotation angle of the component 200 is planned synchronously.

The processor 50 can determine the length and direction of the slot 11 by identifying the positioning image. The processor 50 can determine the angle at which the gripping device 20 and the component 200 need to be rotated after the gripping device 20 clamps the component 200 in the accommodating slot 61 according to the arrangement of the component 200 in the slot accommodating slot 61.

As shown in FIG. 3, for example, when the component 200 is placed in the accommodating box 60, the orientation of the component 200 is the same as the first direction. The length and direction of the slot 11 is the same as the third direction. There is an included angle of 90 degrees between the first direction and the third direction. Therefore, after the gripping device 20 grips the component 200 from the accommodating slot 61, the processor 50 can control the rotating device 70 to work to rotate the gripping device 20 and the component 200 by 90 degrees.

At block 44, controlling the gripping device 20 to insert the components 200 into the slots 11 according to the route information.

After the processor 50 determines the route information, the processor 50 controls the moving device 30, the rotating device 70, and the gripping device 20 to work according to the route information, so as to move the components 200 one by one from the accommodating slot 61 to the slot 11 and insert the components 200 in slots 11. After the component 200 is inserted into the slot 11, the processor 50 controls the gripping device 20 to release the component 200 and return to the accommodating box 60 to clamp another component 200.

At block 45, controlling the operation of the test motherboard 10 to test the components 200.

After the components 200 are inserted into the slots 11, the processor 50 can control the test motherboard 10 to be powered on and work to test whether there are any faulty components 200 that are not working normally.

At block 46, determining whether there is a faulty component 200. If there is a faulty component 200, block 47 is implemented, otherwise block 48 is implemented.

When the test motherboard 10 tests the components 200, the processor 50 may obtain the working parameters of each component 200 from the test motherboard 10, determine whether the components 200 are faulty according to the working parameters. For example, the processor 50 may determine whether the working parameter exceeds the preset rated range, and if the working parameter exceeds the rated range, the processor 50 determines that the component 200 corresponding to the working parameter is faulty.

At block 47, stopping the test and outputting an alarm information.

When a faulty component 200 is found, the test should be stopped in time to avoid further power-on testing of the component 200 to cause more serious failure of the component 200 or failure of the test motherboard 10.

In some embodiments, the processor 50 can be communicatively connected with a terminal device. When the faulty component 200 occurs, the processor 50 can output alarm information to the terminal device to warn the operator to repair the faulty component 200.

The terminal device may be an electronic device with a warning function, such as a warning light, a loudspeaker.

In one embodiment, when the terminal device receives the alarm information output by the processor 50, the terminal device may issue an alarm. For example, a loudspeaker can play an audio alert after receiving an alert message.

In another embodiment, the terminal device may also be a device with human-computer interaction functions, such as a personal computer, an industrial computer, a smart phone. The alarm information output by the processor 50 can be visually presented on the terminal device for the operator to view. For example, the terminal device may be a smart phone, and the output of the alarm information by the processor 50 may be in the form of a short message with the content of "component failure".

At block 48, determining whether a number of times that the components 200 are tested on the motherboard 10 is greater than a first threshold. If the number of testing times is greater than a first threshold, block 410 is implemented, otherwise block 49 is implemented.

The first threshold corresponds to the number of times that the components 200 need to be tested on one test motherboard 10. The first threshold may be preset by the operator according to the model of the component 200 before the component 200 is tested. The number of times that the component 200 is tested on the current motherboard may be counted by the processor 50 each time it controls the test motherboard 10 to work.

The component 200 is tested multiple times on one test motherboard 10, which can improve the accuracy of the test results.

At block 49, controlling the gripping device 20 to insert the components 200 into the other slots 11 on the same test motherboard 10 according to the route information, and returning to block 45 to re-test the components 200.

When the component 200 is tested multiple times on the same test motherboard 10, the component 200 can be inserted into different slots 11 during each test to more accurately determine whether the component 200 is faulty.

The route information may also include a moving route and a rotation angle of the gripping device 20 when the components 200 are moved to another slot 11 one by one. When block 43 is executed, the processor 50 may determine the route information according to the slot changing rule and the positions of the slots 11. When block 49 is executed, the processor 50 can control the moving device 30 and the rotating device 70 to work according to the route information, so as to place the components 200 with other slots 11 for insertion and connection.

As shown in FIG. 1 and FIG. 3, in the embodiment, the slot changing rule can include: removing a designated component 200 in a designated slot 11 from the slot 11; re-using the slots 11 for the remaining components 200 one by one along the preset direction; inserting the removed component 200 into the remaining vacant slot 11 on the test motherboard 10.

The processor 50 controls the gripping device 20, removes a designated component 200 in a designated slot 11 from the slot 11, the processor 50 can place the removed components 200 in the accommodating box 60 according to the route information.

When the removed component 200 is placed in the accommodating box 60 by the gripping device 20, a vacant slot 11 is created on the test motherboard 10. The processor 50 can control the gripping device 20 to place the component 200 which was adjacent to the vacant slot 11 into the vacant slot 11 in a preset direction, and another vacant slot 11 will appear on the test motherboard 10. The processor 50 then controls the gripping device 20 to place the next component 200 adjacent to the currently vacant slot 11 into the currently vacant slot 11 along a preset direction. By analogy, there is always one vacant slot 11 left on the final test motherboard 10, the processor 50 can control the gripping device 20 to move the components 200 in the accommodating box 60 to the vacant slot 11, to complete the slot 11.

For example, the test motherboard 10 may include a first side 13 and a second side 14. The first side 13 and the second side 14 are disposed opposite to each other. The slots 11 are arranged at intervals along the opposite direction of the first side 13 and the second side 14 on the test motherboard 10. In the slot changing rule, the designated slot 11 is the slot 11 closest to the first side 13, and the preset direction is the direction of the second side 14 toward the first side 13, which is the opposite direction of the Y direction as shown in FIG. 3. After the component 200 in the designated slot 11 is removed, the processor 50 controls the gripping device 20 to move the remaining components 200 one by one along the preset direction, and finally vacates the slot 11 closest to the second side 14. The processor 50 then controls the gripping device 20 to insert the previously removed component 200 into the slot 11 closest to the second side 14, so as to complete the placement in the slots 11 for the components 200.

When the components 200 are taken out from the slot 11 one by one, the processor 50 first controls the moving device 30 to drive the gripping device 20 to approach the slot 11, and then controls the unlocking device 90 to push the locking member 12 to unlock the components 200. The processor 50 controls the gripping device 20 to grip the component 200 and controls the moving device 30 to move the component 200 gripped by the gripping device 20. After the components 200 are placed in the slots 11, the processor 50 re-runs block 45 to block 48 to test the components 200 again.

At block 410, determining whether the number of times that the component 200 is moved to another test motherboard 10 is greater than a second threshold when the component 200 is tested. If the number of times that the component 200 is moved to another test motherboard 10 is greater than a second threshold, block 412 is implemented, otherwise block 411 is implemented.

The component 200 needs to be tested multiple times on multiple test motherboards 10. The second threshold corresponds to the number of times that different test motherboards 10 are used when the component 200 is tested. The second threshold may be preset by the operator according to the model of the component 200 before the component 200 is tested. The number of times of substituting the test mainboard 10 when the component 200 is tested may be counted by the processor 50 after each time the processor 50 controls the moving device 30 to move the component 200 to another test mainboard 10.

The component 200 is tested multiple times on one test motherboard 10, and multiple tests are performed on multiple test motherboards 10, which can improve the accuracy of the test results.

At block 411, controlling the gripping device 20 to move the components 200 to another test motherboard 10 one by one, and returning to block 41 to test the components 200 on the substitute test motherboard 10.

The test motherboards 10 can be evenly distributed on the workbench, and the test motherboards 10 are fixedly connected to the workbench. When another test mainboard 10 is used, the position of such test mainboard 10 is different. The processor 50 controls the moving device 30, the rotating device 70 and the gripping device 20 to work, so as to remove the components 200 one by one from the original test motherboard 10 and place them on another test motherboard 10.

In the embodiment, the processor 50 controls the gripping device 20 to move the components 200 on a test motherboard 10 into an accommodating box 60 corresponding to another test motherboard 10, the processor 50 then identifies the positioning image corresponding to the other test motherboard 10 to generate route information, controls the gripping device 20 to remove the components 200 from the accommodating box 60 one by one, and insert them into the slots 11 one by one.

At block 412, ending the test and outputting test data.

The test data may be obtained by the processor 50 summarizing and calculating the working parameters of the component 200 during each test. The processor 50 may acquire and store the operating parameters of the component 200 in the storage device 40 each time the component 200 is tested. After the test is completed, the processor 50 can aggregate and calculate a plurality of working parameters, generate the test data, and output the test data.

The embodiments of the present disclosure do not limit the target for output of test data. For example, the processor 50 can output the test data to the user terminal, so that the operator can view the test data conveniently. For another example, the processor 50 can output the test data to the cloud server, and the cloud server stores the test data in the database or sends the test data to other local servers. The operators can download the test data stored in the database from the local server when they need to view the test data.

The automatic testing method of the present disclosure is applied to the automatic testing device 100.

The storage device 61 stores a program segment. The processor 62 may execute the program code of the program segment to implement blocks 41-412 in the method shown in FIG. 4.

The modules and units which are integrated in the automatic testing device 100, and if implemented in the form of software functional units and sold or used as separate products, may be stored in a computer readable storage medium. Based on such understanding, the present disclosure implements all or part of the processes in the foregoing embodiments, and the purposes of the disclosure may also be implemented and achieved by a computer program instructing related hardware. The computer program may be stored in a computer readable storage medium. The steps of the various method embodiments described above may be implemented by a computer program when executed by a processor. The computer program includes a computer program code, which may be in the form of source code, object code form, executable file, or some intermediate form. The computer readable medium may include any entity or device capable of carrying the computer program code, a recording medium, a USB flash drive, a removable hard disk, a magnetic disk, an optical disk, a computer memory, a read-only memory (ROM), a random access memory (RAM), electrical carrier signals, telecommunications signals, and software distribution media.

It should be noted that the content contained in the computer readable medium can be appropriately increased or decreased according to the requirements of legislation and patent practice in jurisdictions. For example, in some jurisdictions, according to legislation and patent practice, the computer readable medium does not include electric carrier signals and telecommunication signals.

Based on the same concept, the embodiments of the present disclosure also provide a storage medium, the storage medium includes computer instructions. When the computer instruction is executed on an automatic testing device 100, the automatic testing device 100 is caused to execute the automatic testing method provided by the embodiment of the present disclosure.

The embodiment of the present disclosure can control the operation of the automatic testing device 100 through the automatic testing method, and can automatically realize the movement of the components 200 on the test motherboards 10, the insertion and removal of the components 200 into and from the slots 11, and for the test of the components 200 on the test motherboards 10, the process flow of manual operation by operators is reduced, manpower loss is reduced, and the convenience of operation is improved.

Those of ordinary skill in the art should realize that the above embodiments are only used to illustrate the present disclosure, but not to limit the present disclosure. As long as they are within the essential spirit of the present disclosure, the above embodiments are appropriately made and changes fall within the scope of protection of the present disclosure.

What is claimed is:

1. An automatic testing method applicable to an automatic testing device, the automatic testing device comprising a test motherboard and a clamping device, the automatic testing method comprising:
   obtaining a positioning image;
   analyzing position of a plurality of slots of the test motherboard in the positioning image to generate route information; wherein photographing content of the positioning image comprises the test motherboard;
   controlling the clamping device to insert a plurality of the components into the slots according to the route information;
   controlling the test motherboard to test the components;
   determining if there is a faulty component;
   obtaining a working parameter of the component from the test motherboard and determining whether the component is faulty according to the working parameter;
   determining whether the working parameter exceeds a preset rated range;
   determining that the component corresponding to the working parameter is faulty if the working parameter exceeds the preset rated range; and
   controlling the clamping device to insert the components into other slots according to the route information and controlling the test motherboard to retest the components again if there is no faulty component.

2. The automatic testing method of claim 1, wherein the controlling the clamping device to insert the components into other slots according to the route information, further comprises:
  removing a designated component from the slot and creating a vacant slot on the test motherboard;
  taking out remainders of the components from original slot in sequence along a preset direction and inserting the remainders of the components into adjacent and vacant slots; and
  inserting the designated component into the vacant slot.

3. The automatic testing method of claim 1, wherein if there is no faulty component, the automatic testing method further comprises:
  determining whether a number of times that the components are tested on the test motherboard is greater than a preset first threshold; and
  controlling the clamping device to insert the components into other slots according to the route information and controlling the test motherboard to retest the components again if the number of times that the components are tested on the test motherboard is less than or equal to the first threshold.

4. The automatic testing method of claim 3, further comprising:
  determining whether a number of times that the component is moved to another test motherboard is greater than a second threshold when the component is tested; and
  controlling the clamping device to move the components to another test motherboard, controlling another test motherboard to test the components if the number of times of replacing the test motherboard is less than or equal to the second threshold.

5. The automatic testing method of claim 4, further comprising:
  stopping testing if the number of times of replacing the test motherboard is greater than the second threshold.

6. The automatic testing method of claim 5, further comprising:
  determining whether the number of times the component is moved to another test motherboard is less than a second threshold if the number of times that the components are tested on the test motherboard is greater the first threshold.

7. The automatic testing method of claim 1, further comprising:
  controlling a camera device to photograph the positioning image on the test motherboard.

8. The automatic testing method of claim 1, further comprising:
  outputting an alarm information if there is a faulty component.

9. An automatic testing device comprising:
  a test motherboard, wherein the test motherboard defines a plurality of slots;
  a clamping device configured for inserting a plurality of components into the slots;
  a storage device; and
  at least one processor, wherein the storage device stores one or more programs, when executed by the at least one processor, the one or more programs cause the at least one processor to:
  obtain a positioning image;
  analyze position of the slots of the test motherboard in the positioning image to generate route information;
  wherein photographing content of the positioning image comprises the test motherboard;
  control the clamping device to insert the components into the slots according to the route information;
  control the test motherboard to test the components;
  determine if there is a faulty component;
  obtain a working parameter of the component from the test motherboard and determine whether the component is faulty according to the working parameter;
  determine whether the working parameter exceeds a preset rated range;
  determine that the component corresponding to the working parameter is faulty if the working parameter exceeds the preset rated range; and
  control the clamping device to insert the components into other slots according to the route information and control the test motherboard to retest the components again if there is no faulty component.

10. The automatic testing device according to claim 9, wherein the at least one processor is further caused to:
  remove a designated component from the slot and create a vacant slot on the test motherboard;
  take out remainders of the components from original slot in sequence along a preset direction and insert the remainders of the components into adjacent and vacant slots; and
  insert the designated component into the vacant slot.

11. The automatic testing device according to claim 9, wherein the at least one processor is further caused to:
  determine whether a number of times that the components are tested on the test motherboard is greater than a preset first threshold; and
  control the clamping device to insert the components into other slots according to the route information and control the test motherboard to retest the components again if the number of times that the components are tested on the test motherboard is less than or equal to the first threshold.

12. The automatic testing device according to claim 11, wherein the at least one processor is further caused to:
  determine whether a number of times that the component is moved to another test motherboard is greater than a second threshold when the component is tested; and
  control the clamping device to move the components to another test motherboard, controlling another test motherboard to test the components if the number of times of replacing the test motherboard is less than or equal to the second threshold.

13. The automatic testing device according to claim 12, wherein the at least one processor is further caused to:
  stop testing if the number of times of replacing the test motherboard is greater than the second threshold.

14. The automatic testing device according to claim 11, wherein the at least one processor is further caused to:
  determine whether the number of times the component is moved to another test motherboard is less than a second threshold if the number of times that the components are tested on the test motherboard is greater the first threshold.

15. A non-transitory storage medium having stored thereon instructions that, when executed by a processor of a computer device installed in an automatic testing device, cause the processor to perform an automatic testing method, wherein the method comprises:
  obtaining a positioning image;
  analyzing position of a plurality of slots of the test motherboard in the positioning image to generate route information; wherein photographing content of the positioning image comprises the test motherboard;

controlling the clamping device to insert a plurality of the components into the slots according to the route information;

controlling the test motherboard to test the components;

determining if there is a faulty component;

obtaining a working parameter of the component from the test motherboard and determining whether the component is faulty according to the working parameter;

determining whether the working parameter exceeds a preset rated range;

determining that the component corresponding to the working parameter is faulty if the working parameter exceeds the preset rated range; and controlling the clamping device to insert the components into other slots according to the route information and controlling the test motherboard to retest the components again if there is no faulty component.

16. The non-transitory storage medium according to claim 15, further comprising:

removing a designated component from the slot and creating a vacant slot on the test motherboard;

taking out remainders of the components from original slot in sequence along a preset direction and inserting the remainders of the components into adjacent and vacant slots; and inserting the designated component into the vacant slot.

17. The non-transitory storage medium according to claim 15, further comprising:

determining whether a number of times that the components are tested on the test motherboard is greater than a preset first threshold; and controlling the clamping device to insert the components into other slots according to the route information and controlling the test motherboard to retest the components again if the number of times that the components are tested on the test motherboard is less than or equal to the first threshold.

18. The non-transitory storage medium according to claim 17, further comprising:

determining whether a number of times that the component is moved to another test motherboard is greater than a second threshold when the component is tested; and controlling the clamping device to move the components to another test motherboard, controlling another test motherboard to test the components if the number of times of replacing the test motherboard is less than or equal to the second threshold.

19. The non-transitory storage medium according to claim 18, further comprising:

stopping testing if the number of times of replacing the test motherboard is greater than the second threshold.

20. The non-transitory storage medium according to claim 17, further comprising:

determining whether the number of times the component is moved to another test motherboard is less than a second threshold if the number of times that the components are tested on the test motherboard is greater the first threshold.

* * * * *